United States Patent
Wakida et al.

(10) Patent No.: US 9,726,725 B2
(45) Date of Patent: Aug. 8, 2017

(54) POWER CIRCUIT ABNORMALITY DETECTION METHOD

(71) Applicant: JTEKT CORPORATION, Osaka-shi (JP)

(72) Inventors: Mayuko Wakida, Anjo (JP); Yuta Iwai, Ama (JP); Hiroshi Sumasu, Kashihara (JP); Kohji Kimura, Nagoya (JP)

(73) Assignee: JTEKT CORPORATION, Osaka-shi (JP)

( * ) Notice: Subject to any disclaimer, the term of this patent is extended or adjusted under 35 U.S.C. 154(b) by 60 days.

(21) Appl. No.: 14/445,405

(22) Filed: Jul. 29, 2014

(65) Prior Publication Data
US 2015/0035539 A1 Feb. 5, 2015

(30) Foreign Application Priority Data

Aug. 2, 2013 (JP) .................................. 2013-161376
Aug. 2, 2013 (JP) .................................. 2013-161377

(51) Int. Cl.
*G01R 31/327* (2006.01)
*H01H 47/00* (2006.01)
(Continued)

(52) U.S. Cl.
CPC ............ *G01R 31/327* (2013.01); *B60L 3/003* (2013.01); *B60L 3/0046* (2013.01); *B60L 11/005* (2013.01);
(Continued)

(58) Field of Classification Search
CPC ............. Y02T 10/7005; Y02T 10/7055; Y02T 10/7077; Y02T 90/34; B60L 3/04;
(Continued)

(56) References Cited

U.S. PATENT DOCUMENTS 5,619,107 A      4/1997  Shinohara et al.
5,804,973 A *    9/1998  Shinohara ............ B60L 11/1807
                                                                        324/537
(Continued)

FOREIGN PATENT DOCUMENTS

JP    H09-019003 A     1/1997
JP    2001-128305       5/2001
(Continued)

OTHER PUBLICATIONS

Extended European Search Report issued Oct. 16, 2015 in Patent Application No. 14179239.0.
(Continued)

*Primary Examiner* — Alesa Allgood
(74) *Attorney, Agent, or Firm* — Oblon, McClelland, Maier & Neustadt, L.L.P.

(57) ABSTRACT

A power circuit abnormality detection method for a power circuit detects whether an abnormality in a power source relay exists. The power circuit includes a pre-charge circuit opening and closing a connection between a direct current power source and a smoothing condenser by bypassing the power source relay to pre-charge the smoothing condenser, and a discharge circuit connected in parallel to the smoothing condenser to discharge electric charges stored in the smoothing condenser via a discharge resistance when a discharge switch is closed. The power circuit abnormality detection method includes a step of detecting whether the open contact abnormality in the power source relay exists based on whether a charge voltage of the smoothing condenser is reduced when a predetermined period of time has elapsed since both the discharge circuit and the power source relay are closed after the pre-charge circuit is opened.

12 Claims, 6 Drawing Sheets

(51) Int. Cl.
  *B60L 3/00* (2006.01)
  *B60L 11/00* (2006.01)
  *H02M 1/36* (2007.01)
  *H02J 7/34* (2006.01)
  *H02J 7/14* (2006.01)

(52) U.S. Cl.
  CPC .............. *H01H 47/00* (2013.01); *H02M 1/36* (2013.01); *H02J 7/1423* (2013.01); *H02J 7/345* (2013.01); *Y02T 10/7022* (2013.01)

(58) Field of Classification Search
  CPC .. B60L 3/0046; G11C 11/5642; H02J 7/0031; H02J 7/345; H01M 10/625; H01M 10/633; G01R 31/3278; G01R 31/327; G01R 31/3658; G01R 19/16542; G01R 31/002; G01R 31/006; G01R 27/18; B60W 10/26; B60W 20/00; B60K 6/32
  See application file for complete search history.

(56) References Cited

U.S. PATENT DOCUMENTS

| | | | | |
|---|---|---|---|---|
| 6,909,285 B2 * | 6/2005 | Jordan | ............... | G01R 31/3278 324/382 |
| 7,368,829 B2 * | 5/2008 | Tezuka | ................. | H01H 47/002 307/9.1 |
| 8,063,507 B2 * | 11/2011 | Kyono | ............. | H02M 3/33561 307/17 |
| 8,575,940 B2 * | 11/2013 | Yugou | ....................... | B60L 3/04 307/10.1 |
| 9,482,721 B2 * | 11/2016 | Ichikawa | ............ | G01R 31/3277 |
| 2010/0085060 A1 * | 4/2010 | Ichikawa | ............ | G01R 31/3277 324/503 |
| 2011/0210746 A1 * | 9/2011 | Yugou | ....................... | B60L 3/04 324/427 |
| 2013/0093427 A1 * | 4/2013 | Bemrich | ............ | G01R 31/3278 324/418 |
| 2013/0119782 A1 | 5/2013 | Ichikawa et al. | | |
| 2013/0181686 A1 | 7/2013 | Ueda | | |

FOREIGN PATENT DOCUMENTS

| | | | | |
|---|---|---|---|---|
| JP | 2008-154422 | * | 3/2008 | ................ H02P 7/29 |
| JP | 2008-154422 A | | 7/2008 | |

OTHER PUBLICATIONS

Office Action dated Apr. 18, 2017 in Japanese Application No. 2013-1611377.

* cited by examiner

POWER CIRCUIT ABNORMALITY DETECTION METHOD

BACKGROUND

The present invention relates to an abnormality detection method for a power circuit which is contained in a vehicle motor control unit.

Traditionally, relays are generally used to control a power supply from a high-voltage battery to an electric motor or the like. For example, in electrically driven vehicles such as hybrid vehicles or electric vehicles, in order to control a power supply from a high-voltage battery to an inverter which is a load circuit, a power source relay is provided between the battery and the inverter, so that closing and opening a circuit between the battery and the inverter are carried out according to the controlled state of the vehicle by the power source relay. As this occurs, a large rush current flows momentarily from the battery to charge a smoothing condenser of a large capacity, leading to a situation in which contacts of the power source relay are fused. To prevent a risk of failing to cut off the flow of current by switching off the power source relay due to the fused contacts which are kept in contact with each other, a power circuit is proposed which includes a pre-charge circuit which is configured to pre-charge the smoothing condenser before the power relay is switched on (for example, refer to Patent Document 1).

[Patent Document 1] JP-A-2001-128305

SUMMARY

An object of the present invention is to provide a power circuit abnormality detection method which can reduce a detection time to detect an abnormality of open contacts of a power source relay so as to actuate an inverter within a short period of time.

According to an aspect of the invention, there is provided a power circuit abnormality detection method for being applicable to a power circuit and for detecting whether or not an abnormality in a power source relay exists, the power circuit which comprises:

the power source relay which opens and closes a connection between a direct current power source which drives an electric motor and a motor drive circuit which includes a plurality of switching elements and which supplies a drive current to the electric motor;

a smoothing condenser which is connected between a power source wire between the power source relay and the motor drive circuit and a ground wire to absorb ripples in current;

a pre-charge circuit which opens and closes a connection between the direct current power source and the smoothing condenser by bypassing the power source relay to pre-charge the smoothing condenser; and a discharge circuit which is connected between the power source wire and the ground wire in parallel to the smoothing condenser and which discharges electric charges stored in the smoothing condenser via a discharge resistance when a discharge switch is closed, the power circuit abnormality detection method comprising:

detecting whether or not the open contact abnormality in the power source relay exists based on whether or not a charge voltage of the smoothing condenser is reduced when a predetermined period of time has elapsed since the pre-charge circuit is actively opened after both the discharge circuit and the power source relay are closed.

The existence of an open contact abnormality in the power source relay when the discharge circuit is on-state and since the pre-charge circuit is opened may be detected based on an increase in the charge voltage of the smoothing condenser after a predetermined period of time has elapsed after the power source relay is closed.

The power circuit abnormality detection may be configured such that: the pre-charge circuit includes a pre-charge resistance which limits a rush current and a pre-charge relay which opens and closes a connection between the direct current power source and the pre-charge resistance, the pre-charge resistance and the pre-charge relay are connected in series, and the pre-charge circuit is provided in parallel to the power source relay.

A pre-charge voltage of the smoothing condenser may be set by a voltage dividing circuit which is made up of the pre-charge resistance and the discharge resistance.

DETAILED DESCRIPTION OF EXEMPLIFIED EMBODIMENTS

In the power circuit described in the background, the pre-charge circuit includes a pre-charge resistance to limit the rush current and a pre-charge relay which is connected in series with this pre-charge resistance, whereby the pre-charge relay is switched on to pre-charge the smoothing condenser connected to the inverter. After the smoothing condenser is pre-charged, the battery is connected to the inverter after the power source relay which is connected in parallel with the pre-charge circuit is switched on. Then, after the power source relay is switched on, the pre-charge relay is switched off.

When the power source relay cannot be switched on normally, however, the voltage of the smoothing condenser which is so pre-charged decreases gradually. Because of this, there is a situation in which an abnormality of open contact is determined by monitoring rear end (output) side voltage of the power source relay. However, because the smoothing condenser is connected, the voltage decreases gradually, and it takes some time before the voltage decreases to a determination value. Therefore, it is necessary to determine on voltage after a certain period of time elapses. As a result of this, because it takes some time to determine whether or not the power source relay is open, in the event that the power source relay is in proper operation, there is a long period of time before the inverter is actuated, resulting in a possibility that the motor could not be started to be driven at an early timing.

The invention has been made with a view to solving the problem described above, and an object thereof is to provide a power circuit abnormality detection method which can reduce a detection time to detect an abnormality of open contacts of a power source relay so as to actuate an inverter within a short period of time.

Figure 1:
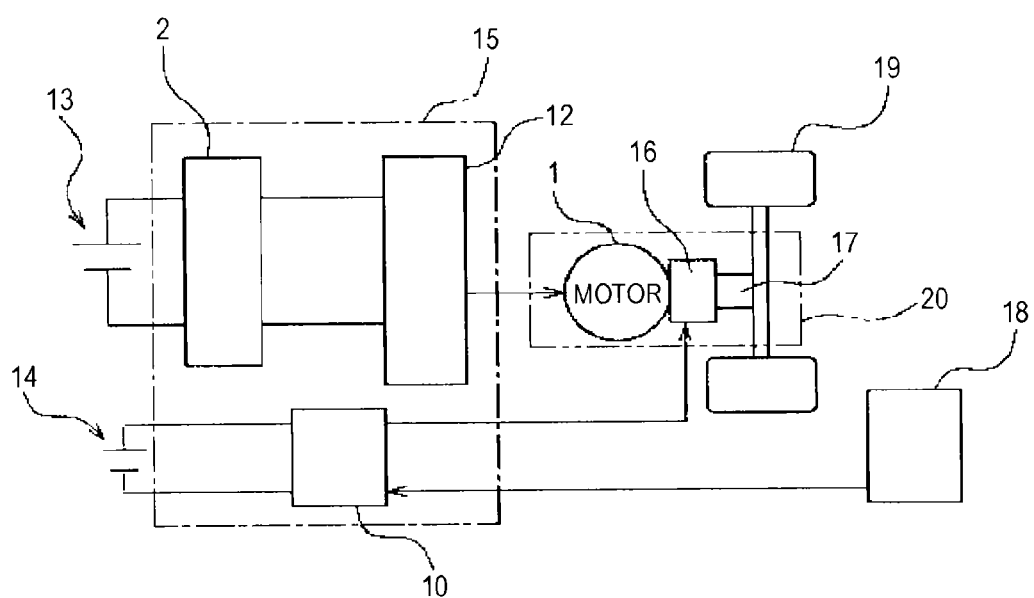
FIG. 1 is a schematic block diagram of a drive system of a vehicle in which a vehicle motor control unit including a power circuit according to the invention is installed.

Next, a power circuit of a motor control system installed in a vehicle according to the invention will be described based on the accompanying drawings. FIG. 1 is a schematic block diagram of a drive system of a vehicle in which a vehicle motor control unit 15 including a power circuit 2 according to the invention is installed. As shown in FIG. 1, a vehicle (for example, a hybrid vehicle or an electric vehicle) includes a direct current power source (hereinafter, referred to as a high-voltage battery) 13, a vehicle control unit 18, a rear wheels drive unit 20, and the vehicle motor control (ECU, hereinafter, referred to as a motor control unit) 15 which controls an electric motor 1 used to drive rear wheels 19. The rear wheels drive unit 20 is made up of the electric motor 1, a reduction gear (a differential gear) 16, and a clutch 17, and the clutch 17 is placed at a final gear of the reduction gear 16. A three-phase brushless motor, for example, is used as the electric motor 1 which constitutes a drive source. The electric motor 1 utilizes a permanent magnet synchronous motor such as an IPM (Interior Permanent Magnet) motor which includes an interior magnet rotor in which a permanent magnet is securely embedded in a rotor core, a SPM (Surface Permanent Magnet) motor which includes a surface magnet rotor in which a permanent magnet is secured to a surface of a rotor core or the like.

The high-voltage battery 13 is a high-voltage (for example, 245V or the like) direct current power source and is made up of a rechargeable battery such as a nickel-metal hydride battery or a lithium ion battery. The high-voltage battery 13 is provided at the rear of a rear seat of the vehicle. The motor control unit 15 receives a high direct current voltage from the high-voltage battery 13 and increases the high direct current voltage received to a higher voltage (for example, 500V or the like) at the power circuit 2 (or maintains the high direct current voltage as it is received without increasing it) according to the specification of an inverter 12 which is a motor drive circuit to supply the resulting direct current voltage to the inverter 12. In addition, when regenerative braking is performed with the electric motor 1 switched to a generator mode, the motor control unit 15 supplies electric energy generated by the electric motor 1 to the high-voltage battery 13 to charge it up. The motor control unit 15 is installed under the rear seat of the vehicle.

Further, the motor control unit 15 includes a control circuit (a signal processing circuit) 10 which controls the rear wheels drive unit 20 and others. The control circuit 10 is connected to a low-voltage (for example, 12V or the like) auxiliary power source (hereinafter, referred to as a low-voltage battery) 14. The control circuit 10 receives a command from the vehicle control unit 18 through CAN to engage the clutch 17 so that a driving force generated as a result of the electric motor 1 being driven is transferred to the rear wheels 19. Additionally, the motor control unit 15 includes the power circuit 2 in which when a much higher direct current voltage is necessary, the direct current voltage received from the high-voltage battery 13 is boosted at a booster converter (not shown) and the boosted direct current voltage is stabilized by a smoothing condenser 11 (refer to FIG. 2), the control circuit 10, and the inverter 12.

Figure 2:
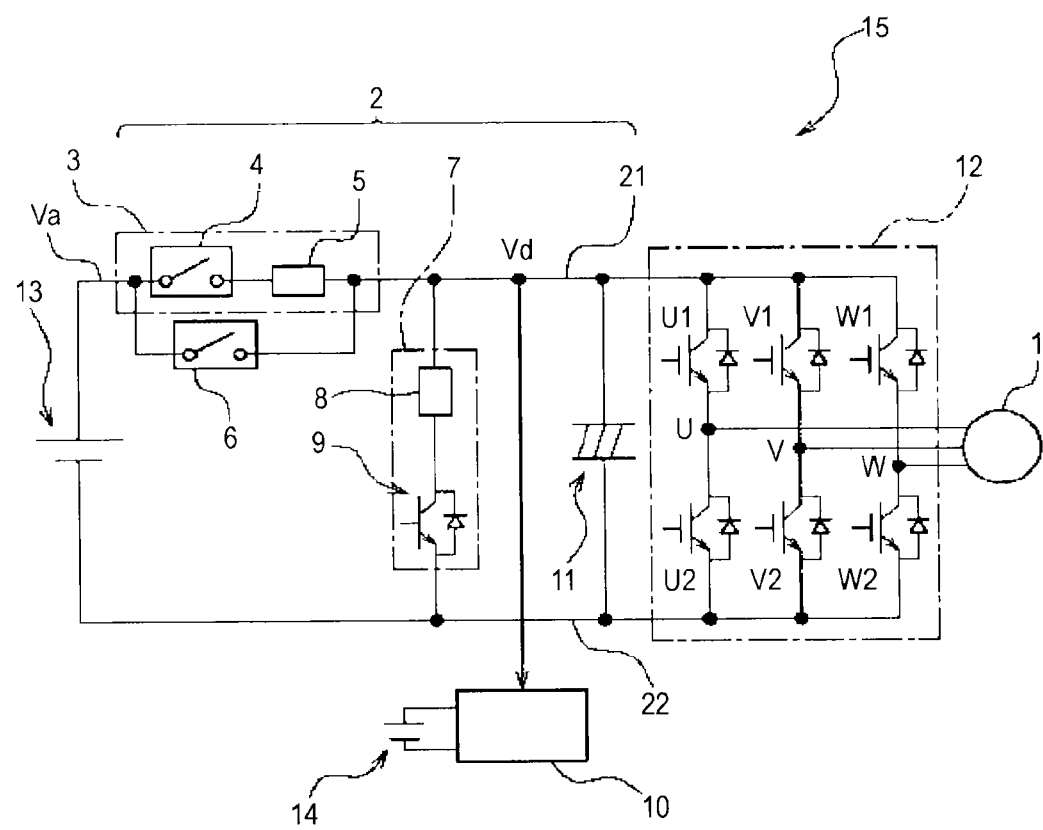
FIG. 2 is a circuit diagram showing a circuit configuration of the vehicle motor control unit including the power circuit shown in FIG. 1.

Next, FIG. 2 is a circuit diagram showing a circuit configuration of the motor control unit 15 including the power circuit 2 shown in FIG. 1. The power circuit 2 shown in FIG. 2 includes a power source relay 6, a pre-charge circuit 3 and a discharge circuit 7. The power source relay 6 is connected to a positive or negative output side of the high-voltage battery 13 to control the supply of power to the inverter. The pre-charge circuit 3 pre-charges the smoothing condenser 11 having a large capacity before the power source relay 6 is switched on. The discharge circuit 7 discharges electric charges stored in the smoothing condenser 11 after the power source relay 6 is switched off so that electric power is consumed when regenerative braking (deceleration) is performed with the electric motor 1 switched to the generator mode. The inverter 12 is connected in parallel to the smoothing condenser 11, and the electric motor 1 is connected thereto via the inverter 12. The pre-charge circuit 3 and the power source relay 6 are controlled by the control circuit 10.

The pre-charge relay 4 and a pre-charge resistance 5 are connected in series in the pre-charge circuit 3. The pre-charge circuit 3 is connected to contacts of the power source relay 6 in parallel and pre-charges the smoothing condenser 11 while limiting a rush current by switching off the pre-charge relay 4 when the power source relay 6 is off. The pre-charge resistance 5 is a rush current preventing resistance (for example, 100Ω) which limits the rush current of the smoothing condenser 11. The pre-charge resistance 5 prevents a large rush current from flowing immediately after the power source relay 6 is switched on, and the smoothing condenser 11 is pre-charged via the pre-charge resistance 5 when the power source relay 6 is off.

The power source relay 6 is a power source switch and is disposed within the power circuit 2. The power source relay 6 switches on or off a connection of the smoothing condenser 11 and the inverter 12 to the high-voltage battery 13. The power source relay 6 is a relay having mechanically movable contacts. The power source relay 6 is on (conductive state) when the motor control unit 15 is operating, while the power source relay 6 is off (non-conductive state) when the motor control unit 15 stops operating. The power source relay 6 pre-charges the smoothing condenser 11 by switching on the pre-charge relay 4 of the pre-charge circuit 3 while it is off. The power source relay 6 is switched from off to on after the smoothing condenser 11 is pre-charged to connect the high-voltage battery 13 directly to the inverter 12. Thereafter, the pre-charge relay 4 is switched off.

The smoothing condenser 11 is provided between a power source wire 21 and a ground (earth) wire 22. The smoothing condenser 11 supplies electric power to the inverter 12 together with the high-voltage battery 13 with the power source relay 6 switched on. In particular, a large electric power is supplied momentarily to the inverter 12 from the smoothing condenser 11. Specifically speaking, the smoothing condenser 11 stores electric charges and discharges the stored electric charges when there is a lack of current flowing from the high-voltage battery 13 to the inverter 12. In this way, the smoothing condenser 11 performs as a condenser which absorbs ripples in the current and which smoothes a supply voltage which drives the electric motor 1. Additionally, in the power circuit 2 of this embodiment, the electric charges stored in the smoothing condenser 11 are discharged through the discharge circuit 7 after the power source relay 6 is switched off.

The discharge circuit 7 is configured so that a discharge switch (for example, IGBT, MOSFET or the like) 9 and a discharge resistance (for example, 500Ω) 8 are connected in series. The discharge circuit 7 is disposed in parallel to the smoothing condenser 11 between the power source wire 21 and the ground wire 22. When the electric motor 1 stops being driven by cutting off the connection to the power source relay 6, the electric charges stored in the smoothing condenser 11 is discharged through the discharge resistance 8 by switching on the discharge switch 9, whereby the voltage Vd of the smoothing condenser 11 drops quickly.

In FIG. 2, the electric motor 1 is a three-phase brushless motor having windings of three phases (U-phase winding, V-phase winding, W-phase winding, not shown). The high-voltage battery 13 is a high-voltage direct current power source which is connected to the inverter 12 t drive the electric motor 1.

The inverter 12 includes six switching elements (for example, IGBT, MOSFET or the like) U1, U2, V1, V2, W1, W2. The six switching elements U1, U2, V1, V2, W1, W2 form three pairs of switching elements of U, V and W phases, and the pair of switching elements of each phase are connected in series to form upper and lower arms (for example, U1, U2). The resulting three pairs of switching elements form three circuits, which are provided in parallel to each other between the power source wire 21 and the ground wire 22. Respective connection points of the upper and lower arms or switching elements of the three phases are connected directly to ends of the U-phase winding, V-phase winding, and W-phase winding. The other ends of the windings of the three phases of the electric motor 1 are connected to a common connection point (a neutral point, not shown).

The control circuit 10 controls the switching elements U1, U2, V1, V2, W1, W2 which are included in the inverter 12. To describe this more specifically, the control circuit 10 determines on target values (target currents) for driving currents of three phases (U-phase current, V-phase current, W-phase current) that are to be supplied to the electric motor 1 and outputs PWM signals which cause currents (respective current values of the three phases) which are detected by a current sensor (not shown) or the like to coincide with the target currents. The PWM signals of the three phases which are outputted from the control circuit 10 are supplied to gate terminals of the switching elements U1, U2, V1, V2, W1, W2 which are included in the inverter 12, respectively. A control voltage (for example, 12V) which constitutes a power source for the control circuit 10 is supplied by the low-voltage battery 14. The low-voltage battery 14 may be an auxiliary battery installed or fed via a DC/DC converter or the like from the high-voltage battery 13.

Figure 3:
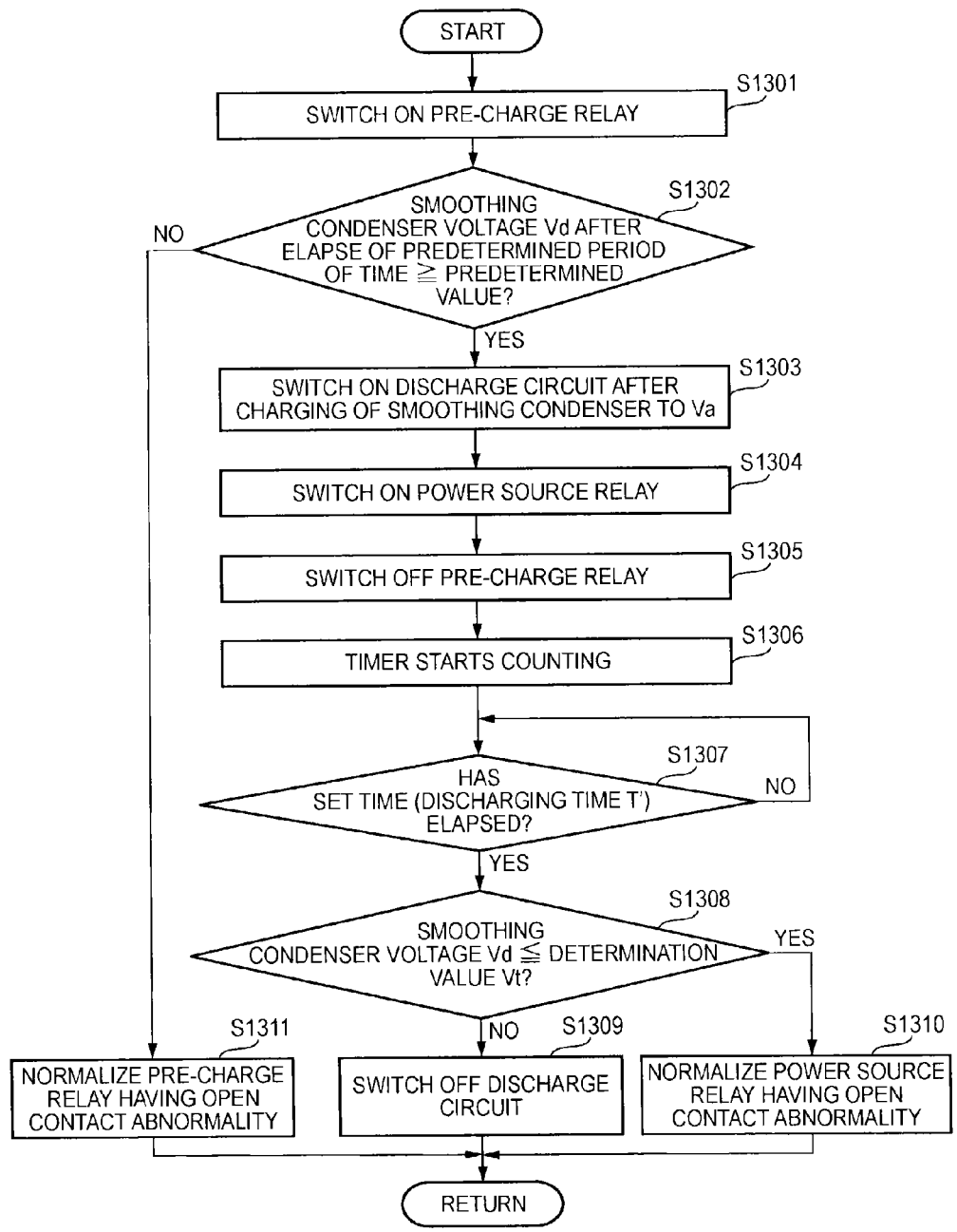
FIG. 3 is a flowchart showing a procedure of executing a detection of an open contact abnormality in a power source relay in a control circuit according to a first embodiment of the invention.

Next, an abnormality detection method according to a first embodiment of the invention will be described. FIG. 3 is a flowchart showing a procedure of executing a detection of an open contact abnormality in the power source relay 6 in the control circuit 10 according to the embodiment of the invention. The open contact abnormality detection method which is executed on the power source relay 6 is executed by the control circuit 10 when the vehicle control is stopped, that is, when the motor control unit 15 which drives the electric motor 1 is actuated. In this embodiment, a CPU (not shown) of the control circuit 10 reads out a program stored in a ROM to execute processes in steps S1301 to S1311 shown in the flowchart in FIG. 3. The processes in the flowchart which will be described below are executed at predetermined time intervals.

Figure 4:
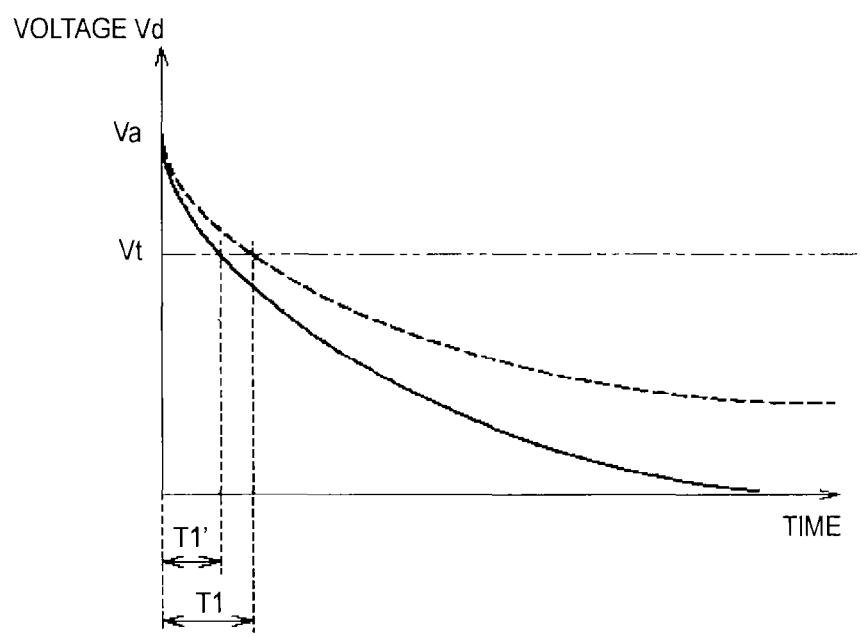
FIG. 4 is a graph showing a voltage-time characteristic of a smoothing condenser when an open contact abnormality occurs in the power source relay according to the first embodiment of the invention.

FIG. 4 is a graph showing a time-voltage characteristic of the smoothing condenser 11 when an open contact abnormality occurs in the power source relay 6. The graph shows a state in which the voltage Vd of the smoothing condenser 11 is pre-charged properly to the supply voltage Va of the high-voltage battery 13 before the power source relay 6 is switched on. As shown in FIG. 4, when an open contact abnormality occurs in the power source relay 6, in relation to a time taken for the voltage Vd of the smoothing condenser 11 to falls from the battery voltage Va to a determination value Vt, a discharging time T1' in a voltage characteristic (indicated by a solid line) which switches on the discharge circuit 7 is shorter than a discharging time T1 in a voltage characteristic (indicated by a broken line) which does not switch on the discharge circuit 7. Consequently, by using the discharging time T1' as a setting time, the detection of open contact abnormality can be started in a short period of time.

As shown in FIG. 3, the CPU of the control circuit 10 in the motor control unit 15 firstly switches on the pre-charge relay 4 (step S1301) to start pre-charging of the smoothing condenser 11.

Next, the CPU determines after a predetermined period of time has elapsed whether or not the voltage Vd of the smoothing condenser 11 reaches or exceeds a predetermined value (step S1302). If the CPU determines that the voltage Vd is smaller than the predetermined value (step S1302: NO), determining that an open contact abnormality has occurred in the pre-charge relay 4, the CPU switches off the pre-charge relay 4, stops pre-charging of the smoothing condenser 11, and executes a normalizing process (step S1311). Thereafter, the CPU ends the open contact abnormality detection flow. If the voltage Vd is determined to be equal to or larger than the predetermined value (step S1302: YES), the flow proceeds to step S1303.

If the CPU determines that the smoothing condenser 11 is properly pre-charged, the CPU continues pre-charging the smoothing condenser 11 to the battery voltage Va. Then, when the smoothing condenser 11 is pre-charged to the battery voltage Va, the CPU switches on the discharge circuit 7 (step s1303). Then, the discharge switch 9 is switched on, whereby the discharge circuit 7 starts discharging.

Following this, after having switched on the power source relay 6 (step S1304), the CPU switches off the pre-charge relay 4 (step S1305) and then stops pre-charging the smoothing condenser 11. When the pre-charging of the smoothing condenser 11 ends with the smoothing condenser 11 pre-charged to the battery voltage Va through this series of operations, a voltage monitoring timer, which counts the discharging time of the smoothing condenser 11 to monitor the voltage Vd, starts counting (step S1306).

Next, the CPU determines whether or not the voltage monitoring timer has timed out its counting time (step S1307). If the CPU determines that the voltage monitoring timer has not yet timed it out (step S1307: NO), the CPU causes the set time to elapse by looping this step until the voltage monitoring timer times out its counting time. When the counting time of the voltage monitoring timer has elapsed to the discharging time T1' (refer to FIG. 4) which is the set time (step S1307: YES), the CPU determines whether or not the voltage Vd of the smoothing condenser 11 is equal to or smaller than the determination value Vt (step S1308).

Here, when the voltage Vd is equal to or smaller than the determination value Vt (step S1308: YES), determining that an open contact abnormality has occurred in the power source relay 6, the CPU switches off the power source relay 6 to stop the power supply and executes a normalizing process (step S1310), thereafter, ending the open contact abnormality detection flow. When the voltage Vd is larger than the determination value Vt (step S1308: NO), determining that the power source relay 6 is normal, the CPU switches off the discharge switch 9 to switch off the discharge circuit 7 (step S1309). Thereafter, the CPU ends the open contact abnormality detection flow.

The function and advantage of the open contact abnormality detection method for the power circuit 2 which is included in the motor control unit 15 according to the embodiment that is configured as has been described heretofore will be described.

According to the configuration described above, the smoothing condenser 11 is connected to the inverter 12 in parallel in the power circuit 2 which is connected between the high-voltage battery (the direct current power source) 13 and the inverter (the motor drive circuit) 12. The smoothing condenser 11 is pre-charged via the pre-charge circuit 3 in which the pre-charge relay 4 and the pre-charge resistance 5 are connected in series while limiting the rush current before the power source relay 6 is switched on. The pre-charge circuit 3 and the power source relay 6 are provided in parallel. The discharge circuit 7 is switched on after the smoothing condenser 11 is pre-charged to the battery voltage Va, and thereafter, the pre-charge relay 4 is switched off after the power source relay 6 is switched on.

When an open contact abnormality is occurring in the power source relay 6 after the series of operations described above has been executed, since the high-voltage battery 13 is not connected to the smoothing condenser 11 and the discharge circuit 7, the voltage (the charge voltage) Vd with which the smoothing condenser 11 is charged falls quickly via the discharge resistance 8 when the discharge switch 9 is switched on and the discharge circuit 7 is on. Namely, the fall of the voltage Vd of the smoothing condenser 11 is accelerated more when the discharge circuit 7 is switched on than when the discharge circuit 7 is not added. Because of this, the discharging time T1' resulting when the discharge circuit 7 is on which is shorter than the discharging time T1 can be set as the waiting time taken until the existence of open contact abnormality is determined by determining whether or not the voltage Vd of the smoothing condenser 11 is equal to or smaller than the determination value Vt after the pre-charge circuit 3 is switched off.

By setting the discharging time T1' as the waiting time, in case a voltage reduction is found by monitoring the voltage Vd of the smoothing condenser 11 after the power source relay 6 has been switched on, it is possible to determined that the open abnormality is occurring. Therefore, it is possible to detect the occurrence of open contact abnormality in the power source relay 6 within a short period of time. As a result of this, when the open contact abnormality is detected in the power source relay 6, it is possible to detect the abnormality in an ensured fashion. Also, the electrical energy stored in the electric motor 1 or the smoothing condenser 11 within the power circuit 2 can be consumed safely, thereby making it possible to avoid a risk of the driver being subjected to an electric shock.

Additionally, when the open contact abnormality occurs in the power source relay 6, the pre-charge relay 4 is used for the power source relay 6 so as to move the vehicle to a safe place without stopping the electric motor 1. Further, since the discharge circuit 7 of the existing smoothing condenser 11 is used, the time taken to detect the open contact abnormality in the power source relay 6 can be shortened without additionally providing any exclusive part.

Thus, according to the embodiment, it is possible to provide the power circuit abnormality detection method which can shorten the time taken to detect the open contact abnormality in the power source relay by reducing the charge voltage of the smoothing condenser by using the discharge circuit to thereby actuate the inverter within a short period of time.

Thus, while the embodiment has been described heretofore, it is possible to carry out the invention in other forms.

In the embodiment, while the normal (mechanical) relays are described as being used for the power source relay 6 and the pre-charge relay 4 to execute the on/off controls, the invention is not limited thereto, and hence, semiconductor switches (for example, a plurality of transistors such as MOSFETs or the like) which can be cut off in both directions may be used to execute on/off operations. Additionally, a mechanical relay may be used for the discharge relay 9.

In this embodiment, in executing the normalizing process when the open contact abnormality is detected in the power source relay 6 or the pre-charge relay 4, the normalizing process may include a process in which a code indicating the details of the abnormality (a failure due to open contacts) is stored in a memory area within the control circuit 10 so that the code can be displayed in a warning display portion or a failure diagnostic unit of the vehicle.

In this embodiment, a process of detecting a short-circuit abnormality in the power source relay 6 and the pre-charge relay 4 by monitoring the voltage Vd of the smoothing condenser 11 in the same way as done in detecting the open contact abnormality may be executed before the process of detecting the open contact abnormality.

Figure 5:
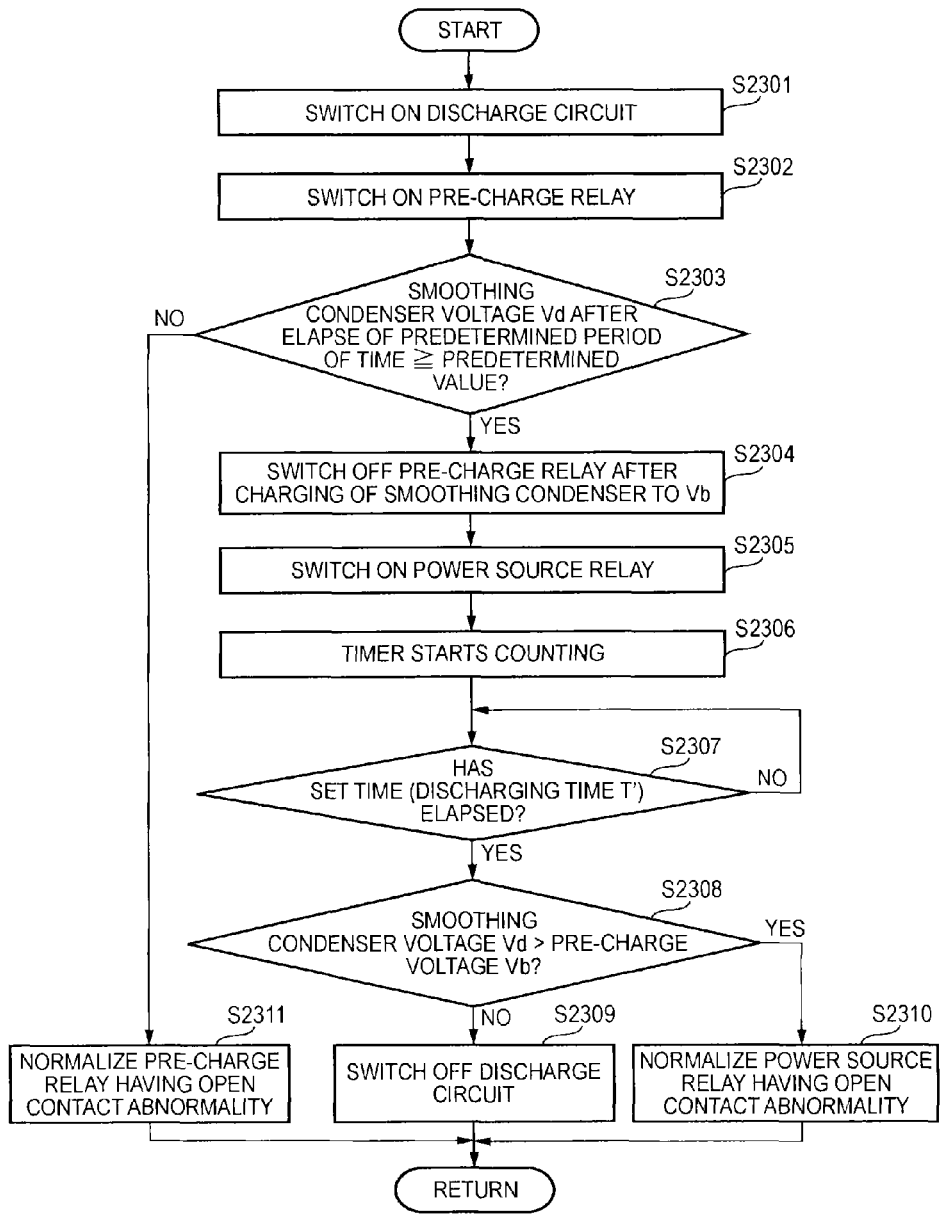
FIG. 5 is a flowchart showing a procedure for executing a detection of an open contact abnormality in a power source relay in a control circuit according to a second embodiment of the invention.
Figure 6:
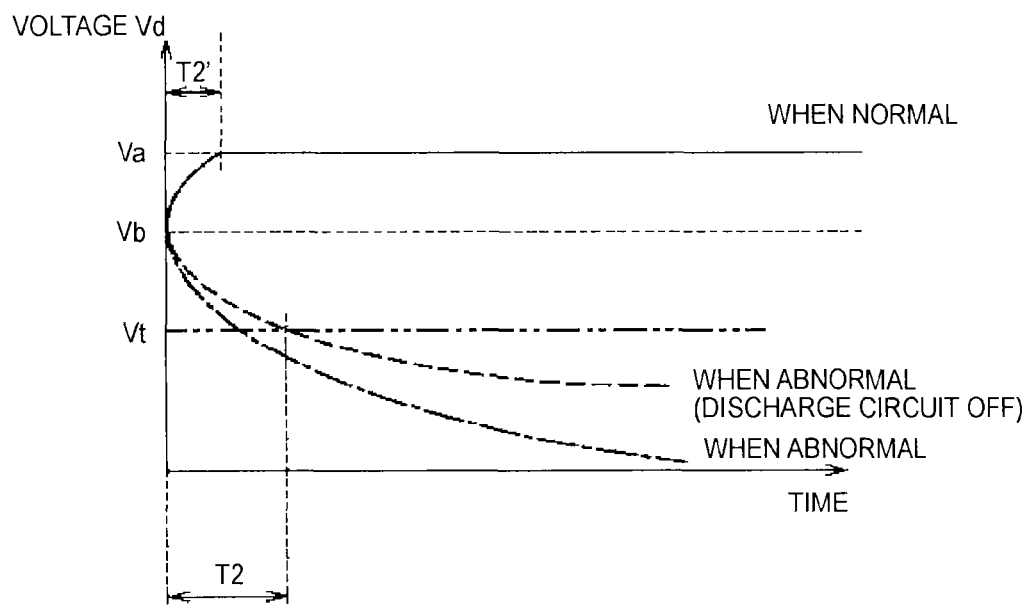
FIG. 6 is a graph showing a voltage-time characteristic of a smoothing condenser when an open contact abnormality occurs in the power source relay according to the second embodiment of the invention.

Next, an abnormality detection method for a power source relay 6 according to a second embodiment of the invention will be described below. FIG. 5 is a flowchart showing a procedure for executing a detection of an open contact abnormality in the power source relay 6 in a control circuit 10 according to the second embodiment. FIG. 6 is a graph showing a voltage-time characteristic of a smoothing condenser 11 when an open contact abnormality occurs in the power source relay 6. An open contact abnormality in the power supply relay 6 is detected by the control circuit 10 when a vehicle control is stopped, that is, a motor control unit 15 which drives an electric motor 1 is actuated. In this embodiment, a CPU (not shown) in the control circuit 10 reads out a program stored in a ROM to execute processes in steps S2301 to S2311 shown in the flowchart in FIG. 5. The processes in the flowchart which will be described below are executed at predetermined time intervals.

FIG. 6 shows a state in which the smoothing condenser 11 is pre-charged properly so that the voltage Vd thereof is boosted to a pre-charge voltage Vb before the power source relay 6 according to this embodiment is switched on. As shown in FIG. 6, after the power source relay 6 is switched on, the voltage Vd of the smoothing condenser 11 exhibits a voltage characteristic indicated by a solid line when the power source relay 6 is normal, and the smoothing condenser 11 is charged immediately to a battery voltage Va of a high-voltage battery 13. In charging the smoothing condenser 11 in this way, a time taken until the smoothing condenser 11 is charged to the battery voltage Va is expressed by a charging time T2'.

Here, when an open contact abnormality is occurring in the power source relay 6, the voltage Vd of the smoothing condenser 11 exhibits a voltage characteristic indicated by a broken line when a discharge circuit 7 is not switched on and reduces moderately. As this occurs, a waiting time taken until an open contact abnormality detection is started is expressed by a discharging time T2 which is taken until the voltage Vd reduces to a determination value Vt. On the other hand, when the discharge circuit 7 is switched on, the voltage Vd of the smoothing condenser 11 exhibits a voltage characteristic indicated by an alternate long and short dash line and falls quickly as a result of the smoothing condenser 11 being discharged by way of a discharge resistance 8. Consequently, the waiting time can be made shorter when the charging time T2' is set as the waiting time than when the discharging time T2 is set as the waiting time (charging time T2'<discharging time T2). As a result of this, the open contact abnormality in the power source relay 6 can be started within a short period time.

As shown in FIG. 5, the CPU of the control circuit 10 in the motor control unit 15 firstly switches on a discharge switch 9 to switch on the discharge circuit 7 (step S2301). Following this, the CPU switches on a pre-charge relay 4 (step S2302) and starts pre-charging the smoothing condenser 11.

Next, the CPU determines after a predetermined period of time has elapsed whether or not the voltage Vd of the smoothing condenser 11 has been boosted up to a predetermined value or higher (step S2303). If the CPU determines that the voltage Vd is smaller than the predetermined value (step S2303: NO), determining that an open contact abnormality has occurred in the pre-charge relay 4, the CPU switches off the pre-charge relay 4 to stop pre-charging the smoothing condenser 11. Following this, the CPU executes a normalizing process (step S2311), ending thereafter the open contact abnormality detection flow. If the CPU determines that the voltage Vd is equal to or larger than the predetermined value (step S2303: YES), the detection flow proceeds to step S2304.

Determining that the smoothing condenser 11 is pre-charged properly, the CPU continues pre-charging the smoothing condenser 11. Then, when the pre-charging of the smoothing condenser 11 is completed, the CPU switches off the pre-charge relay 4 (step S2304) and stops the pre-charging. As this occurs, a pre-charge voltage Vb that results after the pre-charging has ended is expressed by Vb=Va×(Rb/(Ra+Rb)) (where, Va>Vb, Va is the supply voltage of the high-voltage battery 13, and Ra, Rb denote resistance values of the pre-charge resistance 5 and the discharge resistance 8, respectively).

Following this, the CPU switches off the power source relay 6 (step S2305) and causes a voltage monitoring timer to start counting the charging time T2' (refer to FIG. 6) of the smoothing condenser 11 to monitor the voltage Vd of the smoothing condenser 11 (step S2306).

Next, the CPU determines whether or not the voltage monitoring timer has timed out its counting time (step S2307). If the CPU determines that the voltage monitoring timer has not yet timed it out (step S2307: NO), the CPU causes the set time to elapse by looping this step until the voltage monitoring timer times out its counting time. When the counting time of the voltage monitoring timer has elapsed to the normal charging time T2' which is the set time (step S2307: YES), the CPU determines whether or not the voltage Vd of the smoothing condenser 11 is greater than the pre-charge voltage Vb (step S2308).

Here, when the voltage Vd is greater than the pre-charge voltage Vb (step S2308: YES), determining that an open contact abnormality has occurred in the power source relay 6 due to no voltage increase being found, the CPU switches off the power source relay 6 to stop the power supply and executes a normalizing process (step S2310), thereafter, ending the open contact abnormality detection flow. When the voltage Vd is equal to or smaller than the pre-charge voltage Vb (step S2308: NO), determining that the power source relay 6 is normal due to a voltage increase being found, the CPU switches off the discharge switch 9 to switch off the discharge circuit 7 (step S2309). Thereafter, the CPU ends the open contact abnormality detection flow.

Next, the function and advantage of the open contact abnormality detection method for the power circuit 2 which is included in the motor control unit 15 according to the embodiment that is configured as has been described heretofore will be described.

According to the configuration described above, the smoothing condenser 11 is connected to the inverter 12 in parallel in the power circuit 2 which is connected between the high-voltage battery (the direct current power source) 13 and the inverter (the motor drive circuit) 12. The smoothing condenser 11 is pre-charged via the pre-charge circuit 3 while limiting the rush current before the power source relay 6 is switched on in the state that the discharge circuit 7 switches on. The pre-charge circuit 3 and the power source relay 6 are provided in parallel. The smoothing circuit 11 is pre-charged by a voltage dividing circuit which is made up of the pre-charge resistance 5 and the discharge resistance 8 so that the voltage Vd thereof is boosted up to the pre-charge voltage Vb which is divided from the battery voltage Va. After the end of the pre-charging, the power source relay 6 is switched on after the pre-charge relay 4 is switched off. When the power source relay 6 is switched on, the voltage Vd of the smoothing condenser 11 is boosted up to the battery voltage Va immediately within the charging time T2'. Here, during monitoring the voltage Vd, for example, the charging time T2' can be set as the waiting time taken until the open contact abnormality is started in the power source relay 6.

When an open contact abnormality is occurring in the power source relay 6 in this state, since the high-voltage battery 13 is not connected to the smoothing condenser 11 and the discharge circuit 7, with the discharge circuit being on as a result of the discharge switch 9 being switched on, the voltage Vd of the smoothing condenser 11 falls quickly from the pre-charge voltage Vb via the discharge resistance 8. Because of this, the charging time T2' resulting when the discharge circuit 7 is on which is shorter than the discharge time T2 (equal to or smaller than a determination value Vt) resulting when the discharge circuit 7 is off can be set as the waiting time which is taken until it is determined whether or not the voltage Vd of the smoothing condenser 11 is reduced. However, when the open contact abnormality is occurring in the power source relay 6, the voltage Vd of the smoothing condenser 11 falls more quickly than when the discharge circuit 7 is added by switching on the discharge circuit 7.

This enables the voltage Vd of the smoothing condenser 11 to be monitored within the short charging time T2' after the power source relay 6 has been switched on, whereby an open contact abnormality in the power source relay 6 can be detected within the short period of time, thereby making it possible to shorten the actuating time of the inverter 12. As a result of this, when an open contact abnormality is detected in the power source relay 6, the open contact abnormality occurring can be detected in an ensured fashion, and electric energy stored in the electric motor 1 and the smoothing condenser 11 in the power circuit 2 can be consumed in a safe fashion, thereby making it possible to avoid a risk of the driver being involved in an electric shock accident.

In addition, when the open contact abnormality is occurring in the power source relay 6, the pre-charge relay 4 is used in place of the power source relay 6, so that the vehicle can be moved to a safe place without stopping the electric motor 1. Further, since the discharge circuit 7 of the existing smoothing condenser 11 is used, the time taken to detect the open contact abnormality in the power source relay 6 can be shortened without providing additionally an exclusive part. On the other hand, since the voltage Vd of the smoothing condenser 11 can be set arbitrarily by the voltage dividing circuit which is made up of the pre-charge resistance 5 and the discharge resistance 8, a surge which would be generated in switching the pre-charge relay 4 and the power source relay 6 can be suppressed by a combination of the respective resistance values of the resistances.

Thus, according to this embodiment, it is possible to provide the power circuit abnormality detection method which can shorten the detection time to detect an open contact abnormality in the power source relay by monitoring the voltage increase in the smoothing condenser to thereby actuate the inverter within the short period of time.

Thus, while the embodiments of the invention have been described heretofore, it is possible to carry out the invention in other forms.

In the embodiments, while the normal (mechanical) relays are described as being used for the power source relay 6 and the pre-charge relay 4 to execute the on/off controls, the invention is not limited thereto, and hence, semiconductor switches (for example, a plurality of transistors such as MOSFETs or the like) which can be cut off in both directions may be used to execute on/off operations. Additionally, a mechanical relay may be used for the discharge relay 9.

In this embodiment, in executing the normalizing process when the open contact abnormality is detected in the power source relay 6 or the pre-charge relay 4, the normalizing process may include a process in which a code indicating the details of the abnormality (a failure due to open contacts) is stored in a memory area within the control circuit 10 so that the code can be displayed in a warning display portion or a failure diagnostic unit of the vehicle.

In this embodiment, a process of detecting a short-circuit abnormality in the power source relay 6 and the pre-charge relay 4 by monitoring the voltage Vd of the smoothing condenser 11 in the same way as done in detecting the open contact abnormality may be executed before the process of detecting the open contact abnormality according to the flowchart shown in FIG. 5.

In the embodiments that have been described heretofore, while the invention is described as being applied to the inverter 12 which drives the rear wheels driving unit 20, the invention is not limited thereto. Hence, the invention may be applied to an inverter of a high-voltage, large-current electric power steering system or electric brake system or other on-board power transforming system, having the discharge circuit 7. Additionally, the invention may be applied to an inverter which drives a drive motor of a hybrid vehicle or an electric vehicle.

According to the configuration described above, when an open contact abnormality occurs in the power source relay, since the direct current power source is not connected to the smoothing condenser and the discharge circuit, the voltage with which the smoothing condenser is pre-charged falls quickly via the discharge resistance as a result of the discharge circuit being switched on. This enables a time taken until the existence of such an open contact abnormality is determined by monitoring the pre-charge voltage after the pre-charge circuit is switched off to be shortened by setting the discharging time as a waiting time until the start of detection of an open contact abnormality through voltage monitoring. By shortening the waiting time, in case a reduction in the voltage of the smoothing condenser is detected after a certain period of time has elapsed by monitoring the charge voltage of the smoothing condenser, it can be determined that the open contact abnormality is occurring in the power source relay, whereby it is possible to detect the occurrence of open contact abnormality in the power source relay within a short period of time. As a result of this, not only can a failure detection be execute in an ensured fashion, but also electrical energy stored in the electric motor or the power circuit can be consumed safely, thereby making it possible to avoid a risk of the driver being subjected to an electric shock. Additionally, since the open contact abnormality of the power source relay can be detected by using the discharge circuit of the existing smoothing condenser, it is possible to obviate the necessity of providing additionally an exclusive circuit part.

According to the configuration described above, the charge voltage of the smoothing condenser increases to the voltage of the direct current power source quickly when the power source relay is switched on with the discharge circuit being on. By setting this charging time as the waiting time until the start of an open contact abnormality detection through voltage monitoring, the existence of open contact abnormality in the power source relay can be detected. Since the direct current power source is not connected to the smoothing condenser and the discharge circuit, when an open contact abnormality occurs in the power source relay, the voltage which is pre-charged to the smoothing condenser with the discharge circuit being on drops quickly by way of the discharge resistance. Thus, the occurrence of open contact abnormality in the power source relay can be detected within a short period of time by monitoring the charge voltage of the smoothing condenser. As a result of this, not only can a failure detection be execute in an ensured fashion, but also electrical energy stored in the electric motor or the power circuit can be consumed safely, thereby making it possible to avoid a risk of the driver being subjected to an electric shock. Additionally, since the open contact abnormality of the power source relay can be detected by using the discharge circuit of the existing smoothing condenser, it is possible to obviate the necessity of providing additionally an exclusive circuit part.

According to the configuration described above, the pre-charge circuit and the power source relay are provided in parallel to each other, and by monitoring a reduction in charge voltage of the smoothing condenser after pre-charging the smoothing condenser with the power source relay being on, it is possible to detect an open contact abnormality in the power source relay within a short period of time.

Additionally, when an open contact abnormality occurs in the power source relay, the pre-charge relay is used for the power source relay so as to move the vehicle to a safe place without stopping the electric motor.

According to the configuration described above, the smoothing condenser is pre-charged to the pre-charge voltage which is set by the voltage dividing circuit made up of the pre-charge resistance and the discharge resistance, and the increase in charge voltage of the smoothing condenser is accelerated by switching on the power source relay. Because of this, by setting the charging time as a waiting time until the start of detection of an open contact abnormality in the power source relay, a time is shortened which elapses until the existence of an open contact abnormality in the power source relay is determined by monitoring the voltage of the smoothing condenser after the power source relay is switched on is shortened. By determining on the existence of an open contact abnormality in the power source relay in this way, in case no voltage increase is detected in the smoothing condenser within a certain period of time, it can be determined that an open contact abnormality is occurring in the power source relay. Thus, it is possible to detect the open contact abnormality in the power source relay within the short period of time. Additionally, since the increase in charge voltage of the smoothing condenser can be set arbitrarily by the voltage dividing circuit, a surge that would be generated when the pre-charge relay and the power source relays are switched can be suppressed by a combination of resistance values of the pre-charge resistance and the discharge resistance.

According to the invention, it is possible to provide the power circuit abnormality detection method which can shorten the detection time to detect an open contact abnormality in the power source relay by reducing the charge voltage of the smoothing condenser by using the discharge circuit so as to actuate the inverter within a short period of time.

According to the invention, it is possible to provide the power circuit abnormality detection method which can shorten the detection time to detect an open contact abnormality in the power source relay by monitoring the increase in the voltage of the smoothing condenser so as to actuate the inverter within a short period of time.

What is claimed is:

1. A power circuit abnormality detection method for being applicable to a power circuit and for detecting whether or not an abnormality in a power source relay exists, the power circuit which comprises:
   the power source relay which opens and closes a connection between a direct current power source which drives an electric motor and a motor drive circuit which includes a plurality of switching elements and which supplies a drive current to the electric motor;
   a smoothing condenser which is connected between a power source wire between the power source relay and the motor drive circuit and a ground wire to absorb ripples in current;
   a pre-charge circuit which opens and closes a connection between the direct current power source and the smoothing condenser by bypassing the power source relay to pre-charge the smoothing condenser; and
   a discharge circuit, including a discharge switch and a discharge resistance, which is connected between the power source wire and the ground wire in parallel to the smoothing condenser and which discharges electric charges stored in the smoothing condenser via the discharge resistance when the discharge switch is closed,
   the power circuit abnormality detection method comprising:
   detecting whether or not an open-contacts abnormality in the power source relay exists based on whether or not a charge voltage of the smoothing condenser is reduced when a predetermined period of time has elapsed since the pre-charge circuit is actively opened after both the discharge circuit and the power source relay are closed.

2. The power circuit abnormality detection method according to claim 1, wherein opened includes being controlled to be open after having been controlled to be closed.

3. The power circuit abnormality detection method according to claim 1, wherein
   the pre-charge circuit includes a pre-charge resistance which limits a rush current and a pre-charge relay which opens and closes a connection between the direct current power source and the pre-charge resistance,
   the pre-charge resistance and the pre-charge relay are connected in series, and
   the pre-charge circuit is provided in parallel to the power source relay.

4. The power circuit abnormality detection method according to claim 3, wherein
   a pre-charge voltage of the smoothing condenser is set by a voltage dividing circuit which is made up of the pre-charge resistance and the discharge resistance.

5. The power circuit abnormality detection method according to claim 1, wherein the discharge circuit is a circuit whose elements are distinct from the power source relay.

6. The power circuit abnormality detection method according to claim 5, wherein opened includes being controlled to be open after having been controlled to be closed.

7. A power circuit abnormality detection method for being applicable to a power circuit and for detecting whether or not an abnormality in a power source relay exists, the power circuit which comprises:
   the power source relay which opens and closes a connection between a direct current power source which drives an electric motor and a motor drive circuit which includes a plurality of switching elements and which supplies a drive current to the electric motor;
   a smoothing condenser which is connected between a power source wire between the power source relay and the motor drive circuit and a ground wire to absorb ripples in current;
   a pre-charge circuit which opens and closes a connection between the direct current power source and the smoothing condenser by bypassing the power source relay to pre-charge the smoothing condenser; and
   a discharge circuit, including a discharge switch and a discharge resistance, which is connected between the power source wire and the ground wire in parallel to the smoothing condenser and which discharges electric charges stored in the smoothing condenser via the discharge resistance when the discharge switch is closed,
   the power circuit abnormality detection method comprising:
   detecting whether or not an open-contacts abnormality in the power source relay exists based on an increase in a charge voltage of the smoothing condenser after a predetermined period of time has elapsed since the power source relay is closed after the discharge circuit is in an on-state and since the pre-charge circuit is actively opened.

8. The power circuit abnormality detection method according to claim 7, wherein opened includes being controlled to be open after having been controlled to be closed.

9. The power circuit abnormality detection method according to claim 7, wherein
   the pre-charge circuit includes a pre-charge resistance which limits a rush current and a pre-charge relay which opens and closes a connection between the direct current power source and the pre-charge resistance,
   the pre-charge resistance and the pre-charge relay are connected in series, and the pre-charge circuit is provided in parallel to the power source relay.

10. The power circuit abnormality detection method according to claim 9, wherein
a pre-charge voltage of the smoothing condenser is set by a voltage dividing circuit which is made up of the pre-charge resistance and the discharge resistance.

11. The power circuit abnormality detection method according to claim 7, wherein the discharge circuit is a circuit whose elements are distinct from the power source relay.

12. The power circuit abnormality detection method according to claim 11, wherein opened includes being controlled to be open after having been controlled to be closed.

* * * * *